United States Patent [19]
Kodra

[11] Patent Number: 5,566,101
[45] Date of Patent: Oct. 15, 1996

[54] METHOD AND APPARATUS FOR A FINITE IMPULSE RESPONSE FILTER PROCESSOR

[75] Inventor: Gregg S. Kodra, Austin, Tex.

[73] Assignees: SigmaTel, Inc., Austin; Dallas Semiconductor Corp, Dallas, both of Tex.

[21] Appl. No.: 515,414

[22] Filed: Aug. 15, 1995

[51] Int. Cl.$^6$ .................................................. G06F 17/10
[52] U.S. Cl. .................. 364/724.16; 364/724.01
[58] Field of Search .................. 364/724.16, 724.01; 358/17; 341/143; 360/8; 381/94

[56] References Cited

U.S. PATENT DOCUMENTS

| | | | |
|---|---|---|---|
| 4,716,472 | 12/1987 | McNally | 360/8 |
| 4,821,112 | 4/1989 | Sakamoto et al. | 358/17 |
| 4,896,285 | 1/1990 | Ishikawa et al. | 364/724.01 |
| 5,150,120 | 9/1992 | Yunus | 341/143 |
| 5,323,157 | 6/1994 | Ledzius et al. | 341/143 |
| 5,349,546 | 9/1994 | Sharman | 364/724.01 |
| 5,416,847 | 5/1995 | Boze | 381/94 |

*Primary Examiner*—Roy N. Envall, Jr.
*Assistant Examiner*—Monica Lewis
*Attorney, Agent, or Firm*—Jenkens & Gilchrist

[57] ABSTRACT

A method and apparatus for performing finite impulse response filtering in real time is accomplished by taking advantage of symmetrical FIR coefficients of FIR filters in audio equipment. Due to the symmetry of the coefficients, each coefficient, other than the T0 coefficient, has an almost identical counterpart. Thus, only one of the identical coefficient needs to be stored and is used in conjunction with two data points. The two data points are summed together prior to multiplication by the corresponding coefficient to produce an accumulated resultant. This process repeats for each pair of data points, and corresponding FIR coefficient, until a final resultant is obtained.

16 Claims, 6 Drawing Sheets

METHOD AND APPARATUS FOR A FINITE IMPULSE RESPONSE FILTER PROCESSOR

TECHNICAL FIELD OF THE INVENTION

This invention relates generally to filters and, more particularly, to a finite impulse response filter processor.

BACKGROUND OF THE INVENTION

Finite impulse response (FIR) filters are known to digitally perform filtering of digital signals. An FIR filter may be configured to implement a high pass filter, a low pass filter, or a band pass filter. Such filters are widely used in almost all types of audio processing circuitry (Eg. radios, compact disc (CD) players, cellular telephones, personal computers (PC)) and video processing circuitry (Eg. video disc players, video camera recorders (VCR), cameras, etc.).

Generally, an FIR filter operates in the time domain by multiply FIR coefficients with bits of the digital signal and accumulating the results. Values of the FIR coefficients are selected based on the type of filter being implemented and the number of FIR coefficients is based on the desired performance of the FIR filter. For example, a simple 5-tap FIR filter performing a low pass filtering function on a digitized audio signal may have FIR coefficients of $c-2=0.05$, $c-1=0.10$, $c0=0.50$, $c+1=0.25$, and $c+2=0.10$. These coefficients are multiplied with corresponding sampled data points of the digitized audio signal to provide low pass filtering of the digitized audio signal. As is known, the filtering provided by the simple 5-tap filter is relatively poor. To enhance the filtering capabilities of an FIR filter, more taps, and thus more coefficients, are needed.

While the filtering capabilities of an FIR filter can be improved by increasing the number of taps, there is a practical limitation as to how many taps may be added. This limitation is introduced by the speed of the processor performing the multiply and accumulate functions of the FIR process. To operate in real time, the FIR process for a particular data point—one complete loop of multiplying and accumulating the coefficients with corresponding data points—must be completed within the sampling rate. For example, if the sampling rate is 1 MHz, the FIR process must be complete within 1 microsecond. In many audio and/or video products the sampling rate is in the range of 10 MHz and the processor is not totally dedicated to the multiply accumulate function of the FIR process. As a result, FIR filters are not used in such circuits because an FIR filter that provides the needed filtering cannot be processed within the allotted time. In other words, multi-bit FIR filters cannot operate in real time and provide the required filtering.

One solution is to use a single bit FIR filter. A single bit FIR filter eliminates the need for a multiplier, thus substantially reducing the processing time. While the single bit FIR filter eliminates the need for a multiplier, its utilization has some drawbacks. For example, the words used are extremely long which require additional overhead and the sampling rate must be relatively low, in the range of 64 times the signal frequency.

As an alternative to using an FIR filter, many audio and/or video processing equipment utilize an infinite impulse response (IIR) filter. While the IIR filter may be performed in real time, it has nonlinear phase. As such, the IIR filter causes different frequencies to be filtered at different rates, thus introducing noise, or distortion of the signals.

Therefore, a need exists for a high performance multi-bit FIR filter that operates in real time.

DETAILED DESCRIPTION OF THE DRAWINGS

Generally, the present invention provides a method and apparatus for performing finite impulse response filtering. This is accomplished by taking advantage of symmetrical FIR coefficients of FIR filters in audio equipment. Due to the symmetry of the coefficients, each coefficient, other than the T0 coefficient, has an almost identical counterpart. Thus, only one of the identical coefficient needs to be stored which is used in conjunction with two data points. The two data points are summed together and the resultant is multiplying by the particular coefficient to produce an accumulated resultant. This process repeats for each pair of data points, and corresponding FIR coefficient, until a final resultant is obtained. With such a method and apparatus, the number of steps needed to perform such an FIR process is reduced by almost a factor of two which allows multi-bit FIR filtering process to be performed in real time at CD quality.

Figure 1:
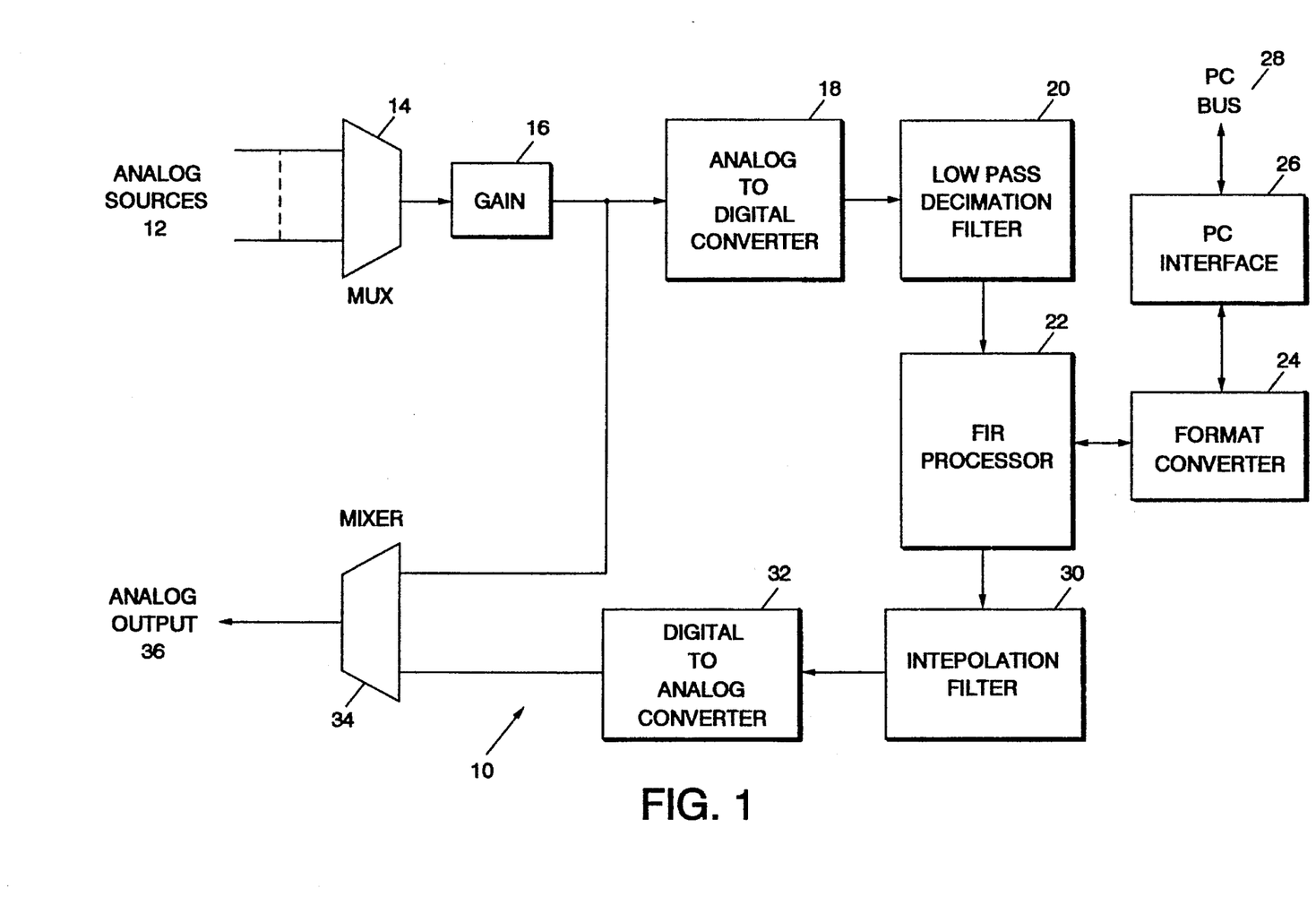
FIG. 1 illustrates an audio processing system in accordance with the present invention.

FIG. 1 illustrates a sound system coder/decoder (CODEC) 10 that includes a multiplexor 14, a gain stage 16, an analog to digital converter (ADC) 18, a low pass decimation filter 20, an FIR processor 22, a format converter 24, a PC interface 26 coupled to a PC bus 28, an interpolation filter 30, a digital to analog converter (DAC) 32, and a mixer 34. In operation, the multiplexer 14 receives a plurality analog signals from analog sources 12 and supplies a selected one of the analog signals to the gain stage 16. The gain stage 16 amplifies the audio signal which is converted into a digitized analog signal via the ADC 18. The gain stage 16 also supplies the amplified analog signal to the mixer 34 such that the incoming analog signal can be mixed with processed, or stored, signals. Note that the analog signal may be an audio signal, videos signal, or subaudible signals. If the analog signal is an audio signal it may be sourced by CD-ROMs, DAT drivers, FM or wave table synthesizers, or any type of digital audio source.

The ADC 18, which may be a sigma-delta converter, provides the digitized analog signal, as a single bit high sampling rate signal, to the low pass decimation filter 30. The low pass decimation filter 20, which may be a comb filter or cascaded integrated comb filter, steps down the sampling rate, reduces quantization noise introduced by the ADC 18, and converts the digitized signal into a multi-bit digital signal. For example, the ADC 18 may output a single bit digital signal having a sampling rate of 9 MHz+/–20% which the low pass decimation filter 30 converts to a 16 bit 500 KHz+/–20% digital signal. The decimated digital signals are routed to the FIR processor 22. Details of the FIR processor 22 will be discussed below with reference to FIGS. 2–7.

As shown, the FIR processor 22 provides processed digital signals to the interpolation filter 30 and transceives digital signals with the format converter 24. Digital signals provided to the interpolation filter 30 will be multi-bit mid range sampling rate digital signals. For example, such digital signals may be 16 bit 350 KHz +/–20% digital signals. Digital signals transcieved with the format converter 24 will be multi-bit low sampling rate signals. For example, such digital signals may be 16 bit 3 KHz to 64 KHz signals.

The format convertor 24 is coupled to the PC interface 26 which, in turn, couples to the PC bus 28. With such a configuration, the sound system CODEC 10, when incorporated in a personal computer (PC), enables the PC to perform multi-media and other audio programs at CD quality levels. With the bi-directional PC interface 26, the PC can provide digitized analog signals to the sound system CODEC 10 for processing, and/or the PC can received processed signal from the sound system CODEC 10. The digitized analog signals may be digitized using either A-law, mu-law or adaptive differential pulse code modulation (ADPCM) techniques which are converted in the format converter 24. These techniques and such conversions are well known in the art; thus, no further discussion will be presented except to illustrate the present invention.

As mentioned, the FIR processor 22 also provides processed digital signals to the interpolation filter 30. The interpolation filter 30, which may be a comb filter or cascaded integrated comb filter, increases the sampling rate of the processed digital signals, reduces the signal to a single bit, and filters images created by the interpolation process. For example, the interpolation filter 30 may receive a 16 bit 350 KHz signal and converts it into a single bit, 6 MHz digital signal.

The interpolated signal is then converted to an analog signal via the DAC 32. The analog signal is routed to the mixer 34 and subsequently rendered audible if the analog signal is an audio signal. Mixer 34 outputs an analog output 36. Note that the sound system CODEC 10 may be implemented discretely, as a separate integrated circuit, or as part of an integrated circuit.

Figure 2:
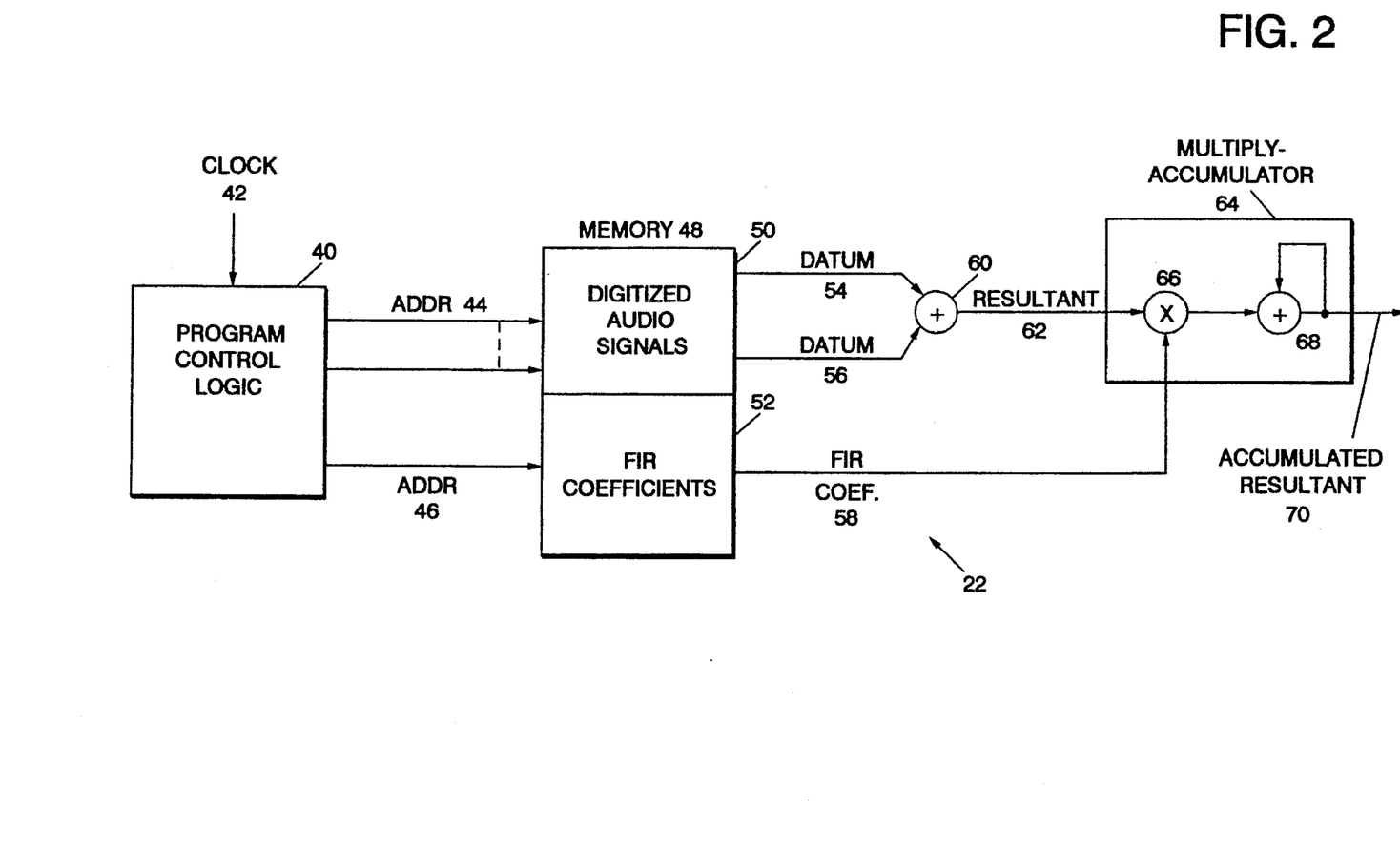
FIG. 2 illustrates a schematic block diagram of the FIR processor of FIG. 1.

FIG. 2 illustrates a schematic block diagram of the FIR processor 22. As shown, the FIR processor 22 includes program logic 40, memory 48, an adder 60, and a multiply accumulator 64. The program logic 40 receives a clock signal and produces addresses 44–46. Functionally, the program logic 40 may be an address generation unit that utilized circular addresses techniques to retrieve FIR coefficients and the appropriate datums, where a datum is a sample point of a digitally sampled analog signal. In a preferred embodiment, the program logic 40 will generate two addresses for retrieval of datums and one address for retrieval of an FIR coefficient. One skilled in the art will readily appreciate that the program logic 40 may generate more than two addresses for retrieval of datums when such datums are to be multiplied by the same coefficient within a given FIR process.

The addresses generated by the program logic are received by the memory 48 which is divided into two sections: one for storing digitized audio signals 50 (datums) and the other for storing FIR coefficients 52. Note that, while the memory 48 is shown as one memory unit having two sections, the memory 48 may be two separate memory units. For example, the digital audio signals 50 may be stored in a volatile memory such Random Access Memory (RAM) while the FIR coefficients may be stored in a nonvolatile memory such as a Read Only Memory (ROM).

The received addresses are used by the memory 48 to retrieve two datums 54, 56 and an FIR coefficient 58. The two datums 54 and 56 are summed together via the adder 60. The resultant is then routed to the multiply accumulator 64, which includes a multiplier 66 and an adder 68 configured as an accumulator. Within the multiply-accumulator 64, the adder resultant 62 is multiplied with the FIR coefficient 58 and subsequently accumulated via the adder 68 to produce an accumulated resultant 70. Thus, for each FIR coefficient retrieved from memory, at least two datums are retrieved, added together, and then multiplied by the FIR coefficient. By adding the two datums together and then performing the multiplication function, the number of multiplication functions required for a multi-bit FIR process is reduced by a factor of about two allowing the process to be performed in real time.

Figure 3:
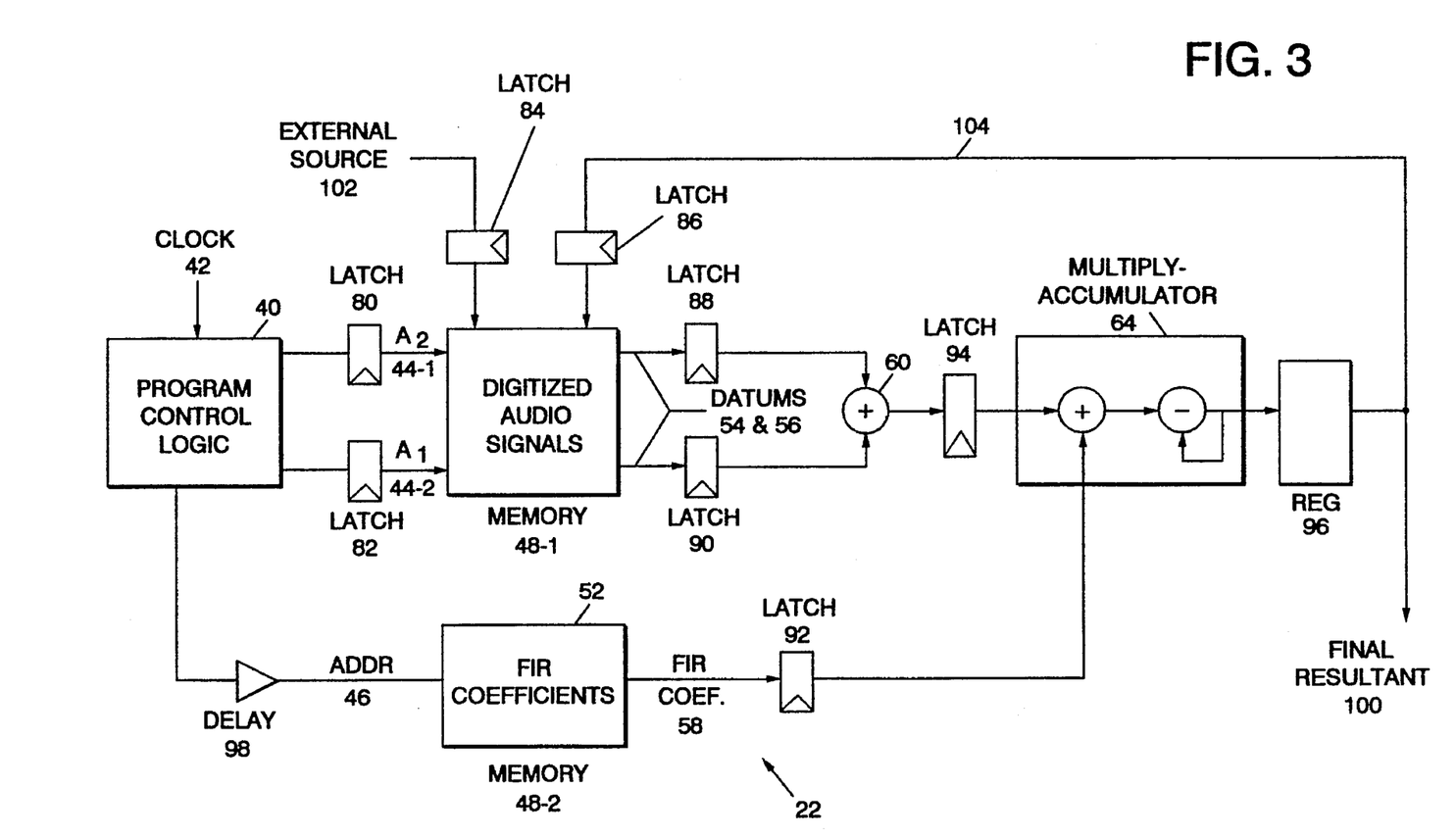
FIG. 3 illustrates a more detailed schematic block diagram of the FIR processor of FIG. 1.

FIG. 3 illustrates a more detailed schematic block diagram of the FIR processor 22. As shown, the FIR processor 22 includes the program logic 40, a plurality of latches 80, 82, 84, 86, 88, 90, 92, and 94, memory 48-1 for storing digitized audio signals 50, memory 48-2 for storing FIR coefficients 52, adder 60, multiply accumulator 64, and a register 96. The program logic 40 receives a clock signal 42 and produces addresses $A_1$ and $A_2$. The operation of the FIR filter 22 of FIG. 3 is similar to that of the operation of the FIR filter of FIG. 2 but further includes the latches 80, 82, 84, 86, 88, 90, 92, and 94 and delay 98 to allow for pipelining of data through the circuit. The FIR filter of FIG. 3 also includes an external source input 102 for inputting the digital signals from low pass decimation filter 20 into memory 48-1. Pipelining of data through a processing system is well known in the art; thus, no further discussion will be presented except to clarify aspects of the present invention.

The register 96 is coupled to the output of the multiply-accumulator 64 and stores intermediate resultants 104. The intermediate resultants 104 may be fed back to the memory 48-1 for additional processing, such as audio mixing, audio reverb, etc. Once the process is complete for a particular set of datums, a final resultant 100 is produced which is subsequently converted into an analog signal by the DAC 32 of FIG. 1.

Figure 4:
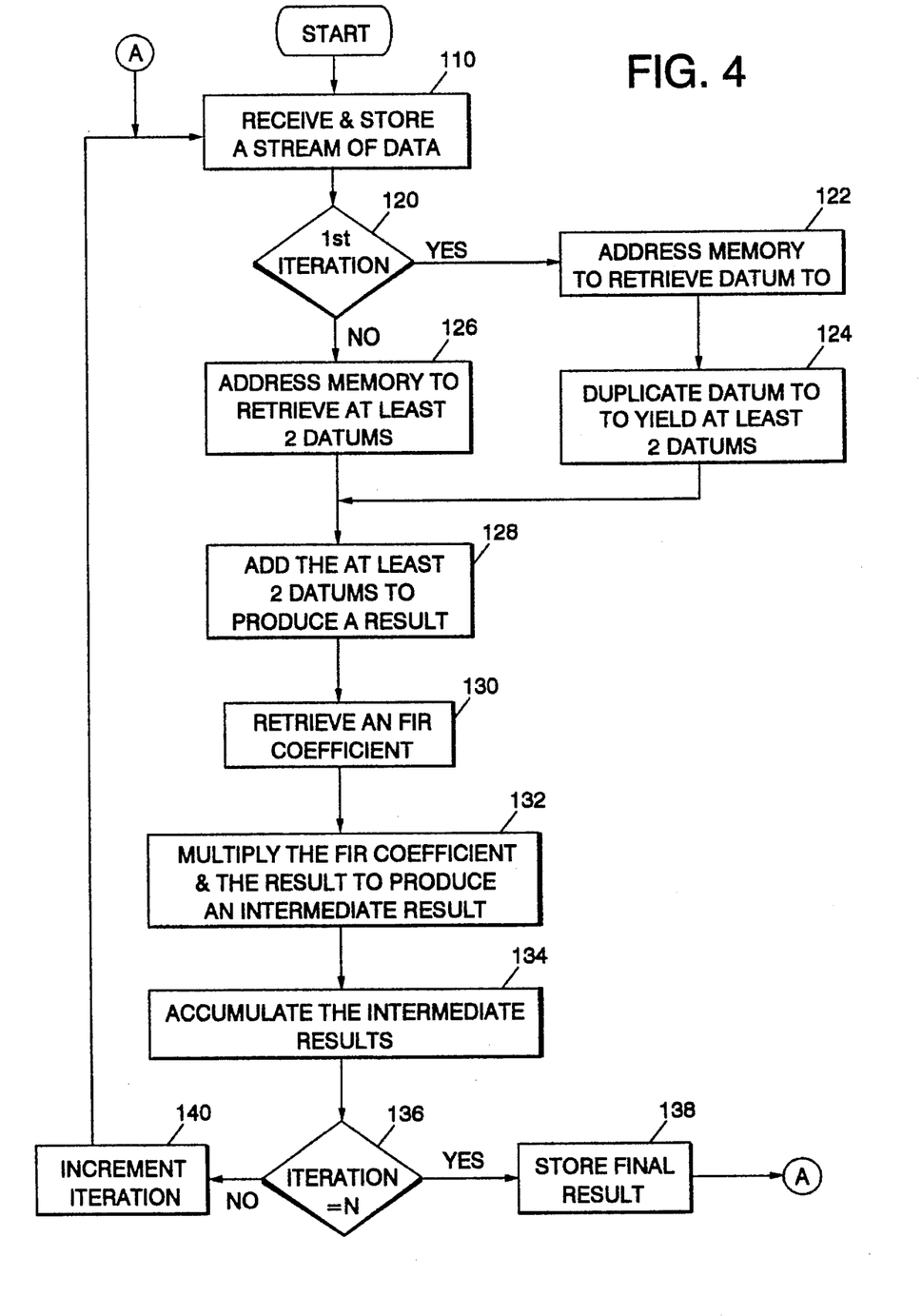
FIG. 4 illustrates a logic diagram that may be used to implement the FIR processor of the present invention.

FIG. 4 illustrates a logic diagram that a digital signal processor, microprocessor, microcontroller, or microcomputer may use to implement an FIR processor in accordance with the present invention. At step 110, the process receives and stores a stream of data as digital sample points, or datums. The process then proceeds to step 120 where it is determined whether this is the first iteration of an FIR process. Note that the iterative process will be discussed more fully with reference to FIG. 5 below. If this is the first iterative step, the process proceeds to step 122 where the memory is addressed to retrieve datum T0. Having retrieved datum T0, the process proceeds to step 124 where datum T0 is duplicated to yield at least two datums. As one skilled in the art will readily appreciate, datum T0 may be duplicated in a variety of ways, such as a double read, double bus path, etc.

After duplicating datum T0, the process proceeds to step 128. With the duplication of datum T0, FIR coefficient c0, which corresponds to datum T0, can be stored at half of its desired value. By storing c0 at half its desired value, an extra bit of accuracy may be obtained without adding to the bit length of the FIR coefficients, since c0 is typically at least twice the value of the next largest FIR coefficient.

If the process determines, at step 120, that this is not the first iteration, the process proceeds to step 126 where memory is address to retrieve at least two datums. Having retrieved the at least two datums, the process proceeds to step 128 wherein the at least two datums are added together to produce a result. At step 130, the process retrieves an FIR coefficient which, at step 132 is multiplied to the result to produce an intermediate result. At step 134, intermediate results are accumulated. After accumulating the most recent intermediate results, the process proceeds to step 136 to determine whether this is the final iteration for this particular FIR process. If this is the final iteration, the process proceeds to step 138 where the most recent accumulated intermediate result is stored as the final result. If not, the process proceeds to step 140 where the iteration is incremented, and the process repeats at step 110. If, however, this is the final iteration, the final result is stored at step 138, and the process repeats at step 110 for the next FIR process.

Figure 5:
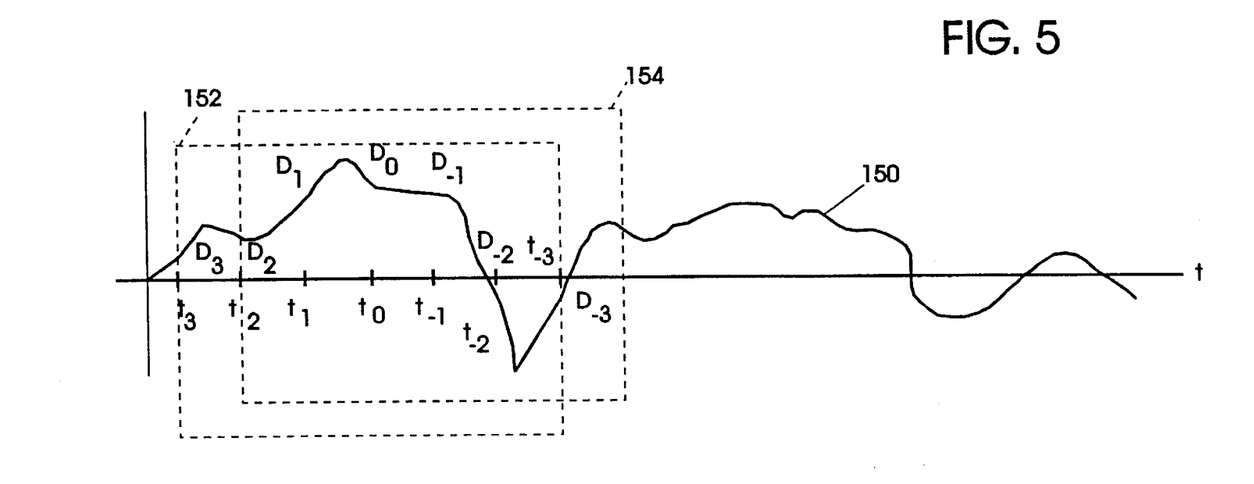
FIG. 5 illustrates a sample wave form that may be processed utilizing the FIR processor of the present invention.

FIG. 5 illustrates an analog signal wave form 150 which is sampled at a particular sampling rate of 1/T. For a 7 tap FIR filter, the analog wave form 150 will be sampled at T0, T+/−1, T+/−2, and T+/−3 for a given FIR process. Thus, for this FIR process of the 7 tap FIR filter, window 152 depicts the datums that will be utilized. The next FIR process is illustrated by window 154 which moves one sampling point in time. This one step movement continues for the analog signal 150 until the entire wave form is swept. At this point, the FIR filter produces a complete digitally filtered representation of the analog signal which, as mentioned above, is converted back into an analog signal via the DAC 32 of FIG. 1.

As further shown in FIG. 5, for each sample point T0 through T+/−3, a datum D0 through D+/−3 is determined. Note that for window 154, the datum which corresponds to T0 is datum D−1 of window 152. Each of the datums D0 through D+/−3 is stored in memory as a multi-bit word. In a preferred embodiment, the datums will be stored as 16-bit words.

Figure 6:
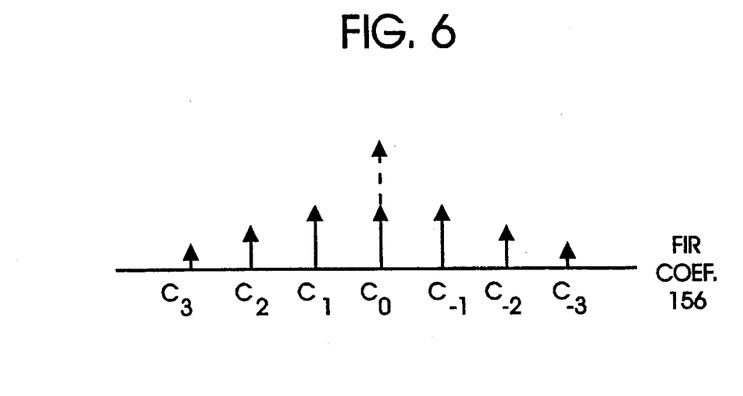
FIG. 6 illustrates the FIR coefficients of a seven-tap FIR filter for use in conjunction with the sample wave form of FIG. 6.

FIG. 6 illustrates FIR coefficients for a 7 tap FIR filter. As shown, the FIR coefficients 156 are symmetrical about the coefficient C0, which is the typical case for an FIR filter being used in audio processing equipment. Coefficient C0 is illustrated in two sections: a solid line section and a dashed line section. The dashed line section plus the solid line section illustrate the desired value of the coefficient. But, because the datum D0 is being duplicated, coefficient C0 may be stored as one-half of the desired value which is shown by the solid line section. With coefficient C0 being stored as one-half the desired value, an extra bit of accuracy can be obtained without added to the bit length.

Figure 7:
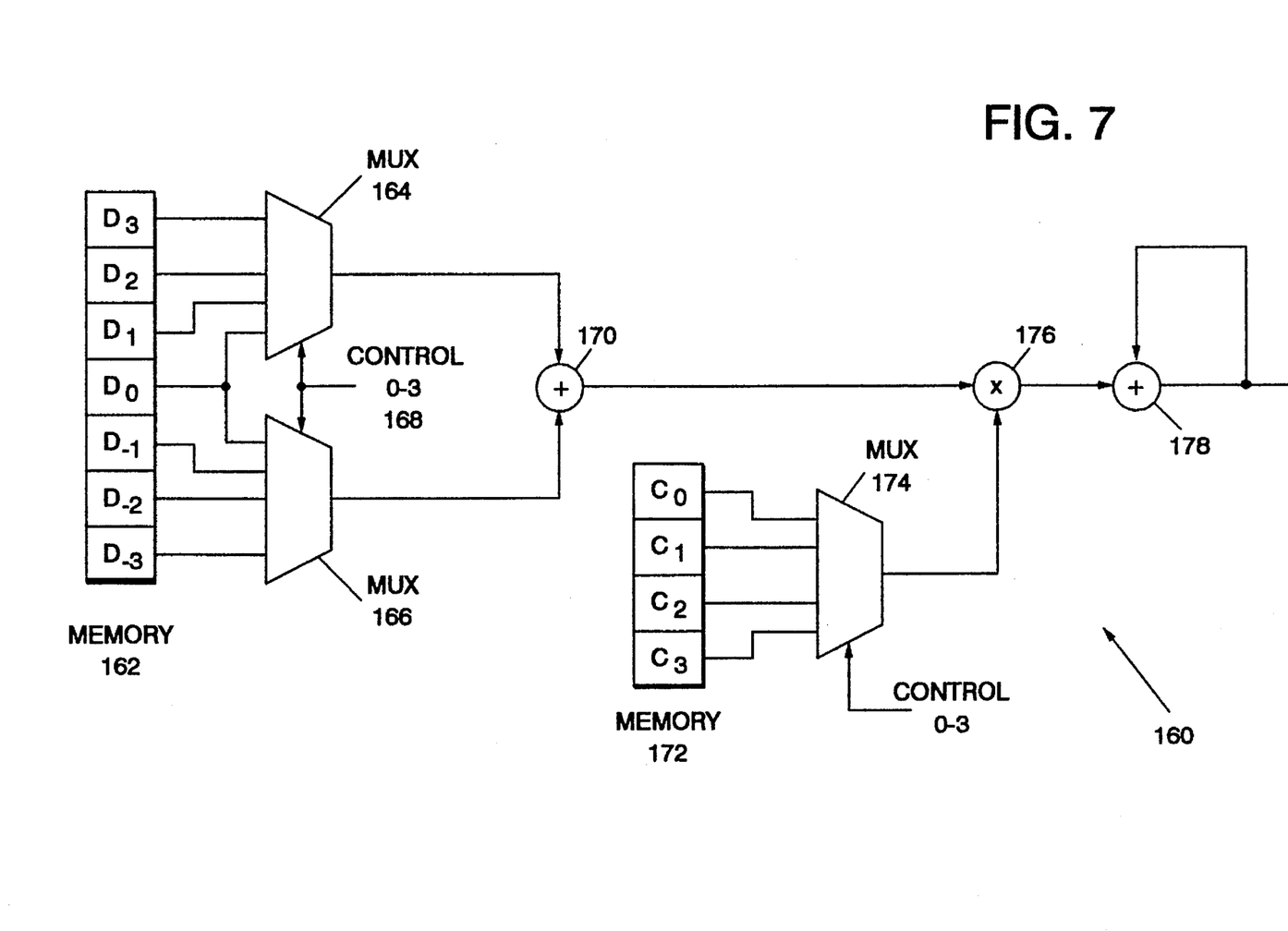
FIG. 7 illustrates a functional schematic diagram of the FIR processor of the present invention processing the sample wave form of FIG. 5 and the FIR coefficients of FIG. 6.

FIG. 7 illustrates a functional schematic diagram of a 7-tap FIR processor 160 operating on the datums of FIG. 5 and the FIR coefficients of FIG. 6. The FIR processor 7 includes memory 162, a pair of multiplexors 164, 166, an adder 170, memory 172, multiplexor 174, multiplier 176, and accumulator 178. As shown, memory 162 stores the datums D0 through D+/−3, while memory 172 stores FIR coefficients C0 through C+/−3. Each of the datum locations of memory 162 are connected to one of the multiplexors 164, 166. Note that the memory location which stores datum D0 is connected to both multiplexors. Thus, when the control signal 168 indicates that datum D0 is to be read, the multiplexors 164 and 166 pass datum D0 to the adder 170. In addition, when the control signal 168 indicates that coefficient C0 is to be read, multiplexor 174 passes the coefficient C0 to multiplier 176. The output of multiplier 176 is routed to accumulator 178.

When the control signal 168 indicates a 1 such that datum D1, datum D−1, and FIR coefficient C1 are to be read, the associated multiplexors 164 and 166 pass the datums to adder 170 and multiplexer 174 passes the coefficient to the multiplier 176. The output of adder 170 is then multiplied by coefficient C1 via the multiplier 176. This process continues until all of the datums and coefficients have been read, added, multiplied, and accumulated to produce the final resultant stored in accumulator 178. Thus, for window 152 of FIG. 5, this is considered to be one FIR process. When an FIR process is performed for window 154, the data shifts in memory 162 such that datum point D−1 now becomes D0.

By utilizing the symmetry of the FIR coefficients 156, the data points that would be multiplied by symmetrical or identical coefficients can be added prior to the multiplication of the coefficients, thereby reducing by a factor of almost 2 the number of multiplications required to perform the FIR process. By reducing the required number of FIR multiplications by a factor of 2, the multi-bit FIR process of the present invention can be performed in real time, achieving CD quality audio signaling.

Note that the examples of FIGS. 5–7 were presented with a 7-tap FIR filter. One skilled in the art will readily appreciate that the concepts of the present invention can be utilized in an FIR filter having more or less taps. Also note that one skilled in the art may utilize the teachings of the present invention wherein the coefficients may not be symmetrical but may have many coefficients that are the same, thus capitalizing on the teachings of the present invention.

What is claimed is:

1. A finite impulse response filter (FIR) processor having a plurality of FIR coefficients symmetrical about a center FIR coefficient such that each of said FIR coefficients has a corresponding identical FIR coefficient counterpart, said FIR processor comprising:

memory having a first memory unit for storing only one of each set of identical FIR coefficients and a second memory unit for temporarily storing a plurality of data points representing digitized analog signals corresponding to said FIR coefficients;

program control logic operably coupled to the memory for providing, at a clock rate, addresses to the memory for retrieval of one FIR coefficient and a first data point corresponding to the FIR coefficient and a second data point corresponding to the identical counterpart of the FIR coefficient;

adder operably coupled to the first memory unit for adding the first data point and the second data point together to produce a resultant; and a multiply-accumulator for multiplying the resultant and the FIR coefficient to produce an accumulated resultant wherein said multiply-accumulator is operably coupled to the adder and the second memory unit such that the FIR coefficient bypasses the adder upon transfer from the second memory unit to the multiply-accumulator and such that the resultant transfers from the adder to the multiply-accumulator.

2. The FIR processor of claim 1 further comprises a register operably coupled to the multiply-accumulator, wherein the register temporarily stores the accumulated resultant as a final resultant when an FIR process is complete.

3. The FIR processor of claim 1 further comprises a register operably coupled to the multiply-accumulator and the memory, wherein the register stores the accumulated resultant and subsequently provides the accumulated resultant to the memory.

4. The FIR processor of claim 1 further comprises a plurality of latches operably coupled to the memory, the program control logic and the multiply-accumulator such that data is pipelined through the FIR processor.

5. The FIR processor of claim 1 further comprises a register operably coupled to the multiply-accumulator and an external digital data source, the register alternately stores the accumulated resultant and portions of the digitized audio signals as the at least two datums.

6. A method for performing finite impulse response (FIR) filtering on a digitized analog signal, by utilizing a plurality of FIR coefficients which are symmetrical about a center FIR coefficient such that each of the FIR coefficients has a corresponding identical FIR coefficient counterpart, the method comprising the steps of:

a) storing only one of each set of identical FIR coefficients in a first memory unit;

b) storing a plurality of data points representing the digitized analog signal in a second memory unit;

c) retrieving from the first memory unit one FIR coefficient;

d) retrieving from the second memory unit a first data point corresponding to the FIR coefficient;

e) retrieving from the second memory unit a second data point corresponding to the identical counterpart of the FIR coefficient;

f) adding the first data point and the second data point to produce a resultant;

g) multiplying the FIR coefficient and the resultant to produce an intermediate resultant; and h) accumulating the intermediate resultant with other intermediate resultants until a final resultant is obtained, wherein the final resultant represents an FIR filtered representation of the digitized analog signal.

7. The method of claim 6, wherein step (h) further comprises the steps of:

performing steps (c) through (g) for N iterations to produce the intermediate resultant and the other intermediate resultants, wherein N represents one-half the number of taps in the FIR filtering plus one.

8. The method of claim 7, wherein steps (d) and (e) further comprise:

receiving a d0 datum as the first data point wherein d0 corresponds to the center FIR coefficient;

receiving a duplicate of the d0 datum as the second data point for a first iteration of the N iterations; and receiving d1, d−1 datums through d(N−1), d(N−1) datums as the first and second data points for iterations 2 through N of the N iterations.

9. The method of claim 6, further comprising the steps of:

receiving a stream of data representing the digitized analog signal;

storing the stream of data in the second memory unit; and addressing the second memory unit to retrieve two data points from the stream of data.

10. The method of claim 6, wherein step (b) further comprises:

storing the final resultant in the second memory unit; and addressing the second memory unit to retrieve the final resultant for use as the first or second data point.

11. A sound system coder/decoder (CODEC) comprising:

analog-to-digital converter;

digital-to-analog converter;

a low pass decimation filter operably coupled to the analog-to-digital converter, wherein the low pass decimation filter decimates digital signals received from the analog-to-digital converter;

an interpolation filter operably coupled to the digital-to-analog converter, wherein the interpolation filter interpolates a processed digital signal; and a finite impulse response filter (FIR) processor having a plurality of FIR coefficients symmetrical about a center FIR coefficient such that each of said FIR coefficients has a corresponding identical FIR coefficient counterpart operably coupled to supply the processed digital signal to the interpolation filter, wherein the FIR processor includes:

memory having a first memory unit for storing only one of each set identical FIR coefficients and a second memory unit for temporarily storing a plurality of data points representing digitized analog signals received via the low pass decimation filter;

program control logic operably coupled to the memory for providing, at a clock rate, addresses to the memory for retrieval of one FIR coefficient and a first data point corresponding to the FIR coefficient and a second data point corresponding to the identical counterpart of the FIR coefficient that represent at least a portion of the digitized analog signals;

adder operably coupled to the first memory unit for adding the first data point and the second data point together to produce a resultant; and a multiply-accumulator for multiplying the resultant and the FIR coefficient to produce an accumulated resultant wherein said multiply-accumulator is operably coupled to the adder in the second memory unit such that the FIR coefficient bypasses the adder upon transfer from the second memory unit to the multiply-accumulator and such that the resultant transfers from the adder to the multiply-accumulator.

12. The sound system CODEC of claim 11 further comprises a format converter operably coupled to the FIR processor, the format converter converts digitized audio signals between A-law, mu-law, and adaptive pulse code modulation.

13. The sound system CODEC of claim 12 further comprises a personal computer interface operably coupled to the format converter such that a personal computer performs audio class audio processing.

14. The sound system CODEC of claim 11, wherein the low pass decimation filter comprises a comb filter.

15. The sound system CODEC of claim 11, wherein the interpolation filter comprises a comb filter.

16. The sound system CODEC of claim 11 further comprises being implemented on an integrated circuit.

* * * * *

UNITED STATES PATENT AND TRADEMARK OFFICE
CERTIFICATE OF CORRECTION

PATENT NO.    : 5,566,101

DATED         : October 15, 1996

INVENTOR(S)   : Kodra

It is certified that error appears in the above-indentified patent and that said Letters Patent is hereby corrected as shown below:

Column 8, line 27          Delete "set identical"
                               Insert --set of identical--

Signed and Sealed this

Fifteenth Day of July, 1997

Attest:

BRUCE LEHMAN

Attesting Officer          Commissioner of Patents and Trademarks